(12) United States Patent
Kim et al.

(10) Patent No.: US 8,278,723 B2
(45) Date of Patent: Oct. 2, 2012

(54) THIN FILM TRANSISTOR SUBSTRATE AND METHOD OF MANUFACTURING THE SAME

(75) Inventors: Kyung-Wook Kim, Seoul (KR);
Jong-Hwan Lee, Anyang-si (KR);
Young-Woon Kho, Cheonan-si (KR);
Jae-Hyun Park, Yongin-si (KR)

(73) Assignee: Samsung Electronics Co., Ltd.,
Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/496,298

(22) Filed: Jul. 1, 2009

(65) Prior Publication Data

US 2010/0051952 A1 Mar. 4, 2010

(30) Foreign Application Priority Data

Sep. 3, 2008 (KR) .................. 10-2008-0086890

(51) Int. Cl.
*H01L 29/72* (2006.01)
(52) U.S. Cl. ............... 257/390; 257/401; 257/618
(58) Field of Classification Search .................. 257/390, 257/401, 618
See application file for complete search history.

(56) References Cited

U.S. PATENT DOCUMENTS

| | | | |
|---|---|---|---|
| RE40,673 E | * | 3/2009 | Kanbara et al. ............... 345/100 |
| 2004/0075784 A1 | * | 4/2004 | Yeo et al. ........................ 349/43 |

FOREIGN PATENT DOCUMENTS

| | | |
|---|---|---|
| JP | 2007-121788 | 5/2007 |
| KR | 1020040078422 A | 9/2004 |
| KR | 1020050068187 A | 7/2005 |

* cited by examiner

*Primary Examiner* — Edward Wojciechowicz
(74) *Attorney, Agent, or Firm* — F. Chau & Associates, LLC

(57) ABSTRACT

A thin film transistor substrate capable of appropriately maintaining driving performance even when there is a difference between manufacturing processes and a method of manufacturing the same. The thin film transistor substrate includes: a gate electrode formed on an insulating substrate; a semiconductor layer formed on the gate electrode; and a plurality of thin film transistors each having a source electrode and a drain electrode that are formed on the gate electrode and the semiconductor layer so as to be spaced apart from each other. At least one of the plurality of thin film transistors is a dummy thin film transistor that does not have the semiconductor layer between the source electrode and the drain electrode.

6 Claims, 24 Drawing Sheets

TR_1

TR_1

TR_5

TR_1

TR_5

TR_1

TR_5

TR_1

TR_5

TR_1

TR_5

TR_1

TR_5

TR_1

TR_5

TR_1

TR_5

TR_1

TR_5

TR_1

TR_5

TR_1

TR_5

TR_1

TR_5

TR_1

TR_5

TR_1

TR_5

TR_1

TR_5

TR_1'

TR_7'

TR_5'

THIN FILM TRANSISTOR SUBSTRATE AND METHOD OF MANUFACTURING THE SAME

CROSS-REFERENCE TO RELATED APPLICATION

This application claims priority from Korean Patent Application No. 10-2008-0086890 filed on Sep. 3, 2008 in the Korean Intellectual Property Office, the disclosure of which is incorporated herein by reference in its entirety.

BACKGROUND

1. Technical Field

The present disclosure relates to a thin film transistor substrate and a method of manufacturing the same and, more particularly, to a thin film transistor substrate capable of appropriately maintaining driving performance, even when there is a difference between manufacturing processes, and a method of manufacturing the same.

2. Discussion of Related Art

With improvements in information technology, there is an increasing demand for display devices having a large size and a small thickness. CRT displays according to the related art, however, are insufficient to meet the demand. Therefore, flat display devices, such as a PDP (plasma display panel), a PALC (plasma address liquid crystal display panel), an LCD (liquid crystal display), and an OLED (organic light emitting diode) device, are in great demand.

In general, a display device includes a lower substrate having thin film transistors formed thereon, an upper substrate opposite to the lower substrate, and a liquid crystal layer interposed between the two substrates. An electric field applied to the liquid crystal layer is adjusted to display images. The display device further includes gate and data drivers that drive a display panel.

In the display device, the gate driver driving the display panel includes a gate driving integrated circuit (IC), and the gate driving IC is mounted in a TCP (tape carrier package) or COG (chip on the glass) technique. Other methods, however, that are advantageous in terms of manufacturing cost, size of products, and design have been developed. For example, instead of the gate driving IC, a gate driver that uses an amorphous silicon thin film transistor (hereinafter referred to as a-Si TFT) to generate a gate signal is mounted to a glass substrate of a display panel.

The driving performance of the thin film transistor greatly depends on differences between manufacturing processes. More specifically, in a process of exposing a photoresist layer, the width and the shape of the channel of the thin film transistor depend on the amount of light radiated to the photoresist layer. Therefore, a structure capable of appropriately maintaining a driving performance, even when there is a difference between manufacturing processes, is needed.

SUMMARY OF THE INVENTION

Exemplary embodiments of the present invention provide a thin film transistor substrate capable of appropriately maintaining driving performance even when there are differences between manufacturing processes.

Exemplary embodiments of the present invention also provide a method of manufacturing a thin film transistor substrate capable of appropriately maintaining driving performance even when there are differences between manufacturing processes.

The exemplary embodiments, features and advantages of the present invention are not, however, restricted to the ones set forth herein. The above and other exemplary embodiments, features and advantages of the present invention will become more apparent to one of ordinary skill in the art to which the present invention pertains by referencing a detailed description of exemplary embodiments of the present invention given below.

According to an exemplary embodiment of the present invention, there is provided a thin film transistor substrate including: a gate electrode formed on an insulating substrate; a semiconductor layer formed on the gate electrode; and a plurality of thin film transistors each having a source electrode and a drain electrode that are formed on the gate electrode and the semiconductor layer so as to be spaced apart from each other. At least one of the plurality of thin film transistors is a dummy thin film transistor without the semiconductor layer between the source electrode and the drain electrode.

According to an exemplary embodiment of the present invention, there is provided a thin film transistor substrate including: a gate electrode formed on an insulating substrate; a semiconductor layer formed on the gate electrode; and a plurality of thin film transistors each having a source electrode and a drain electrode that are formed on the gate electrode and the semiconductor layer so as to be spaced apart from each other. One or more thin film transistors among the plurality of thin film transistors have different channel lengths.

According to an exemplary embodiment of the present invention, there is provided a method of manufacturing a thin film transistor substrate, the method including: forming a gate electrode on an insulating substrate; forming a semiconductor layer and a data wiring conductive film on the gate electrode; forming a photoresist layer on the data wiring conductive film; radiating light to the photoresist layer through a mask to form a photoresist pattern, the mask including a transmissive region that transmits light, a light-shielding region that shields light, a first transflective region that is provided between the light-shielding regions and that partially transmits light, and a second transflective region that is provided between the light-shielding regions, that partially transmits light, and that has a reflectance that is higher than that of the transmissive region and that is lower than that of the first transflective region; and etching the data wiring conductive film using the photoresist pattern to form a source electrode and a drain electrode.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1:
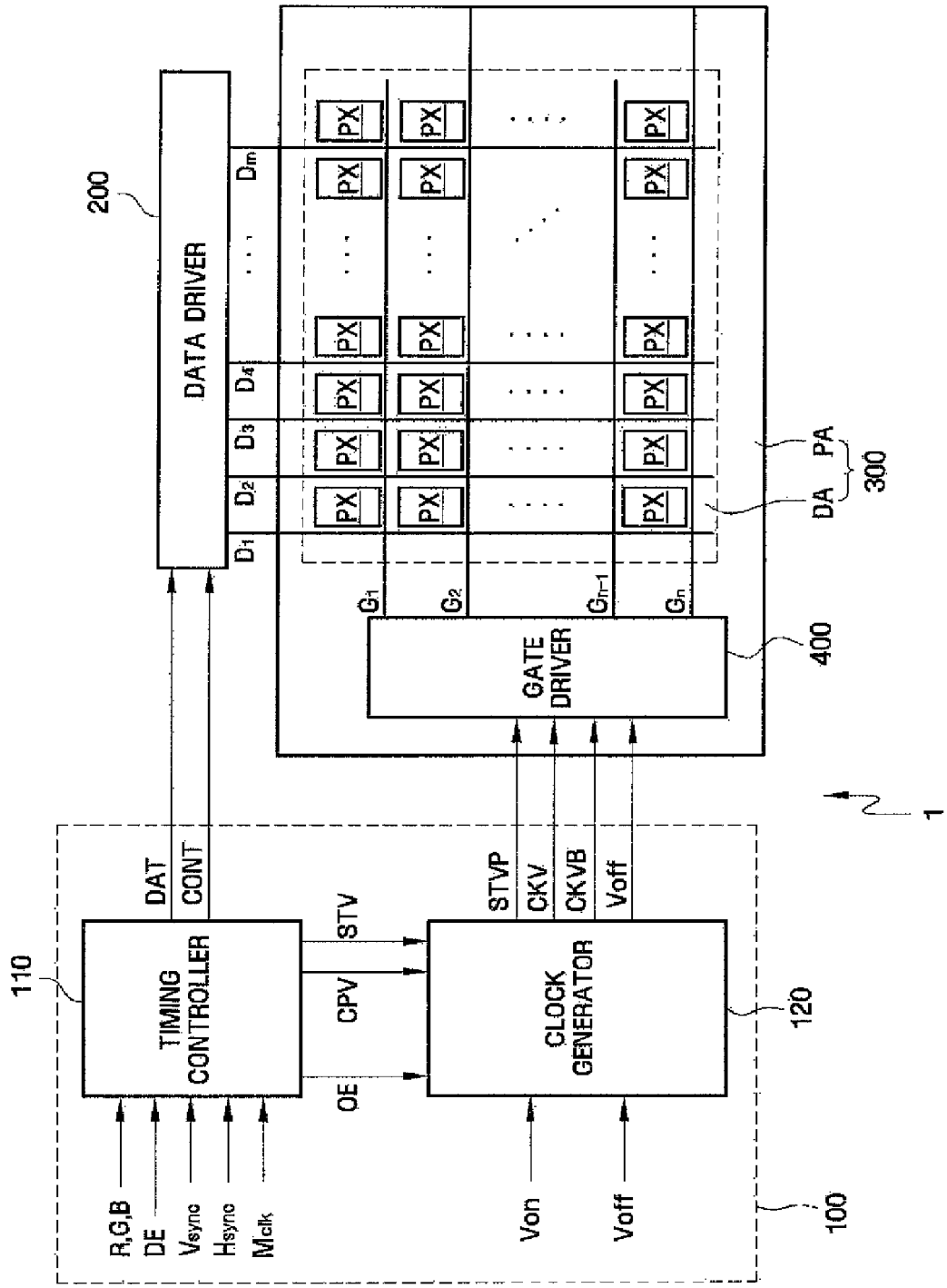
FIG. 1 is a block diagram schematically illustrating the operation of a display device including a thin film transistor substrate according to an exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the present invention to those of ordinary skill in the art, and the present invention will only be defined by the appended claims. Like reference numerals refer to like elements throughout the specification.

Figure 2:
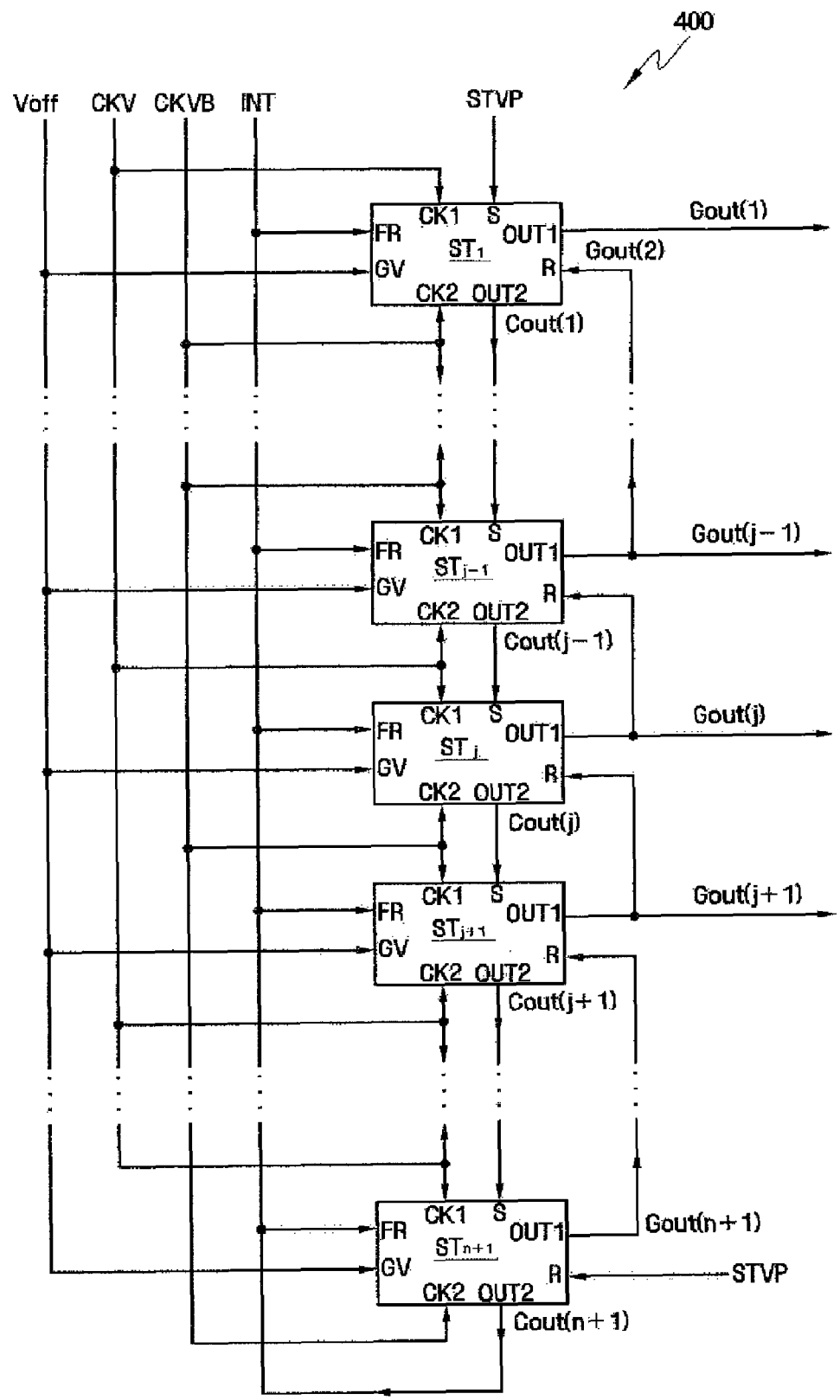
FIG. 2 is a block diagram illustrating a gate driver shown in FIG. 1.
Figure 3A:
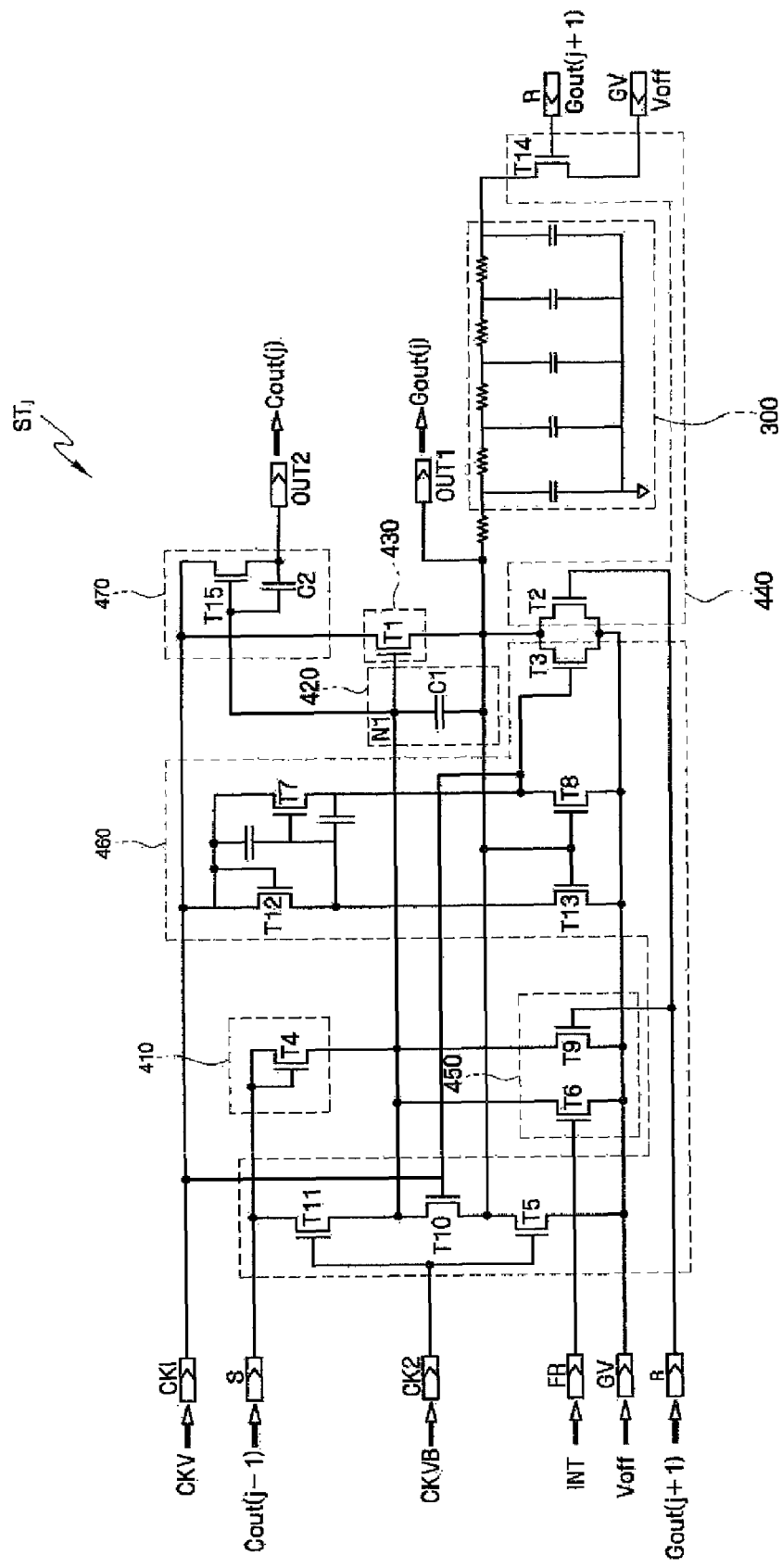
FIG. 3A is a circuit diagram schematically illustrating a j-th stage shown in FIG. 2.
Figure 3B:
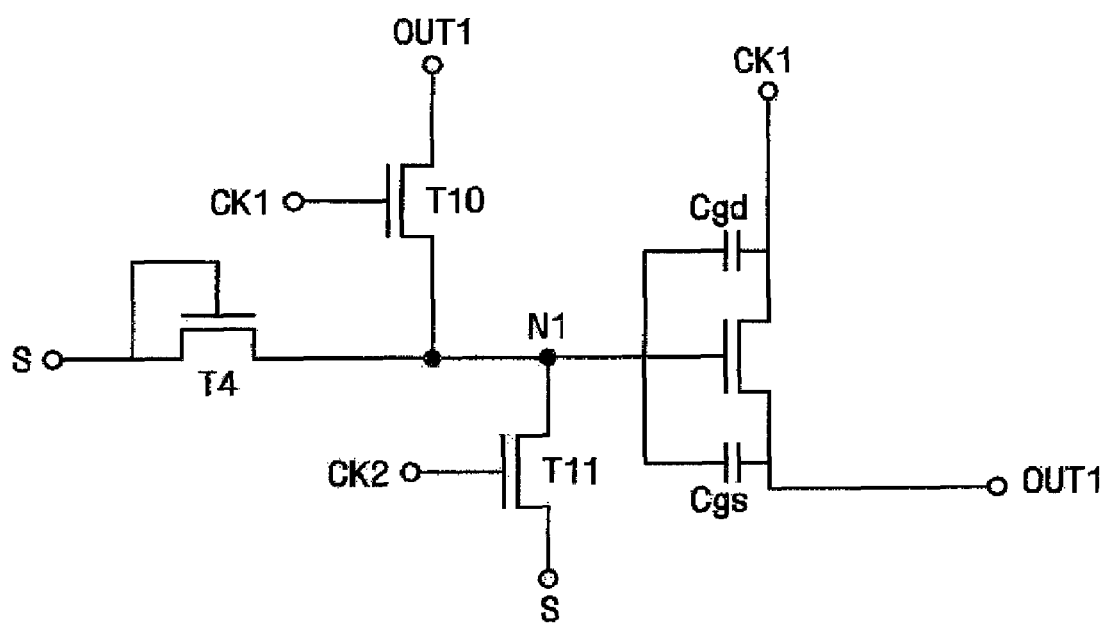
FIG. 3B is a circuit diagram schematically illustrating a process of supplying gate signals.

Hereinafter, the driving of a display device including a thin film transistor substrate according to an exemplary embodiment of the present invention will be described in detail with reference to FIGS. 1 to 3B. FIG. 1 is a block diagram schematically illustrating the operation of the display device including the thin film transistor substrate according to an exemplary embodiment of the present invention. FIG. 2 is a block diagram illustrating a gate driver shown in FIG. 1. FIG. 3A is a circuit diagram schematically illustrating a j-th stage shown in FIG. 2, and FIG. 3B is a circuit diagram schematically illustrating a process of supplying gate signals.

First, referring to FIG. 1, a display device 1 includes a display panel 300, a signal supplying unit 100, a gate driver 400, and a data driver 200. The signal supplying unit 100 includes a timing controller 110 and a clock generator 120.

The display panel 300 is divided into a display area DA in which an image is displayed using pixels PX and a non-display area PA in which no image is displayed.

The display area DA includes a lower display panel having a plurality of gate lines G1 to Gn, a plurality of data lines D1 to Dm, switching elements (not shown), and pixel electrodes (not shown) formed thereon, an upper display panel having color filters (not shown) and a common electrode (not shown) formed thereon, and a liquid crystal layer (not shown) interposed between the upper and lower display panels, such that an image is displayed. The gate lines G1 to Gn extend substantially in a row direction so as to be parallel to one another, and the data lines D1 to Dm extend substantially in a column direction so as to be parallel to one another.

The non-display area PA is a portion of the lower display panel that protrudes from the upper display panel when the lower and upper display panels overlap each other, and no image is displayed in the non-display area PA.

The signal supplying unit 100 includes the timing controller 110 and the clock generator 120. The timing controller 110 receives input image signals R, G, and B and input control signals for controlling the image signals from an external graphic controller (not shown), and outputs an image signal DAT and a data control signal CONT to the data driver 200. Specifically, the timing controller 110 receives input control signals, such as a vertical synchronization signal Vsync, a horizontal synchronization signal Hsync, a main clock signal Mclk, and a data enable signal DE, and outputs the data control signal CONT. The data control signal CONT is for controlling the operation of the data driver 200, and includes a horizontal start signal for starting the operation of the data driver 200 and a load signal for instructing the output of two data voltages.

The data driver 200 receives the image signal DAT and the data control signal CONT, and outputs an image data voltage corresponding to the image signal DAT to each of the data lines D1 to Dm. The data driver 200 is composed of an IC and may be connected to the display panel 300 in the form of a tape carrier package (TCP), however, the present invention is not limited thereto. For example, the data driver 200 may be formed on the non-display area PA of the display panel 300.

The clock generator 120 receives a gate-on voltage Von and a gateoff voltage Voff from a voltage generator (not shown), and supplies a first start signal STVP, a clock signal CKV, a clock bar signal CKVB, and the gate-off voltage Voff to the gate driver 400. Specifically, the timing controller 110 supplies a second start signal STV, a first clock generation control signal OE, and a second clock generation control signal CPV. The clock generator 120 receives the second start signal STV, and outputs the first start signal STVP. In addition, the clock generator 120 receives the first clock generation control signal OE and the second clock generation control signal CPV, and outputs the clock signal CKV and the clock bar signal CKVB. The clock signal CKV is reversed in phase relative to the clock bar signal CKVB.

The gate driver 400 is enabled in response to the first start signal STVP, uses the clock signal CKV, the clock bar signal CKVB, and the gate-off voltage Voff to generate a plurality of gate signals, and sequentially supplies the generated gate signals to the gate lines G1 to Gn.

The gate driver 400 will be described in detail with reference to FIG. 2, wherein it is shown that the gate driver 400 includes a plurality of stages ST1 to STn+1. The stages ST1 to STn+1 are connected to one another in a cascade manner. All the stages ST1 to STn other than the last stage STn+1 are connected in one-to-one correspondence to the gate lines G1 to Gn, and produce output gate signals Gout1 to Gout(n). The gate-off voltage Voff, the first clock signal CKV, the second clock signal CKVB, and an initialization signal INT are input to each of the stages ST1 to STn+1. The initialization signal INT, although not shown in FIG. 1, is for initializing a frame.

The initialization signal INT may be supplied from the clock generator 120, and it may be a carry signal Cout(n+1) of the last stage STn+1.

Each of the stages ST1 to STn+1 includes a first clock terminal CK1, a second clock terminal CK2, a set terminal S, a reset terminal R, a power supply voltage terminal GV, a frame rest terminal FR, a gate output terminal OUT1, and a carry output terminal OUT2.

For example, a j-th (j≠1) stage STj connected to a j-th gate line Gj includes a set terminal S to which a carry signal Cout(j−1) of the previous stage STj−1 is input, a reset terminal R to which a gate signal Gout(j+1) of the next stage STj+1 is input, a first clock terminal CK1 and a second clock terminal CK2 to which the first clock signal CKV and the second clock signal CKVB are respectively input, a power supply voltage terminal GV to which the gate-off voltage Voff is input, and a frame reset terminal FR to which the initialization signal INT or a carry signal Cout(n+1) of the last stage STn+1 is input. In addition, the j-th stage STj includes a gate output terminal OUT1 through which a gate signal Gout(j) is output and a carry output terminal OUT2 through which the carry signal Cout(j) is output.

Instead of the previous carry signal, a first scan start signal STVP is input to the first stage ST1, and instead of the next gate signal, the first scan start signal STVP is input to the last stage STn+1.

A high-level clock signal input from the first clock terminal CK1 is output from each of the gate output terminals Gout(1) to Gout(n) of the stages ST1 to STn. That is, a high-level first clock signal CKV is output from the gate output terminals OUT1 of the odd-numbered stages ST1, ST3, . . . , ST(2n−1), and a high-level second clock signal CKVB is output from the gate output terminals OUT1 of the even-numbered stages ST2, ST4, . . . , ST2n. Therefore, the stages can sequentially output the gate signals Gout(1) to Gout(n).

The j-th stage STj shown in FIG. 2 will now be described in detail with reference to FIG. 3.

The j-th stage STj includes a buffer unit 410, a charge unit 420, a pull-up unit 430, a carry signal generator 470, a pull-down unit 440, a discharge unit 450, and a holding unit 460. The j-th stage STj includes transistors T1 to T14, and the transistors T1 to T14 may be amorphous silicon thin film transistors or polycrystalline silicon thin film transistors.

The previous carry signal Cout(j−1), the first clock signal CKV, and the second clock signal CKVB are input to the j-th stage STj. The first clock signal CKV includes a sustain period for which the signal is maintained at a low level and a transition period for which the signal is changed from a low level to a high level or from a high level to a low level.

The buffer unit 410 includes a transistor T4 having a gate electrode and a drain electrode that are commonly connected to the set terminal S and a source electrode that is connected to a first node N1. The buffer unit 410 supplies the previous carry signal Cout(j−1) input through the set terminal S to the charge unit 420, the carry signal generator 470, and the pull-up unit 430.

The charge unit 420 includes a capacitor C1 having one end that is connected to the first node N1 among the source of the transistor T4, the pull-up unit 430, and the discharge unit 450, and the other end that is connected to the gate output terminal OUT1.

The pull-up unit 430 includes a transistor T1, and the transistor T1 has a drain electrode that is connected to the first clock terminal CK1, a gate electrode that is connected to the first node N1, and a source electrode that is connected to the gate output terminal OUT1.

The carry signal generator 470 includes a transistor T15 having a drain electrode connected to the first clock terminal CK1, a source electrode connected to the carry output terminal OUT2, and a gate electrode connected to the buffer unit 410, and a capacitor C2 connected to the gate electrode and the source electrode of the transistor. The carry signal generator 470 outputs a high-level first clock signal CKV to the carry output terminal OUT2 when the potential of the first node N1 is changed to a high level.

The pull-down unit 440 includes polycrystalline silicon thin film transistors, and lowers the gate signal Gout(j) to the gate-off voltage Voff. A first pull-down transistor T2 has a drain electrode connected to the source of the transistor T1 and to the other end of the capacitor C1, a source electrode connected to the power supply voltage terminal GV, and a gate electrode connected to the reset terminal R. A second pull-down transistor T14 has a source electrode connected to the power supply voltage terminal GV and a drain electrode connected to the j-th gate line Gj of the display panel 300.

The discharge unit 450 includes a transistor T9 that has a gate electrode connected to the reset terminal R, a drain electrode connected to the first node N1, and a source electrode connected to the power supply voltage terminal GV and discharges the charge unit 420 in response to the gate signal Gout(j+1) of the next stage STj+1, and a transistor T6 that has a gate electrode connected to the frame reset terminal FR, a drain electrode connected to one end of a capacitor C3, and a source electrode connected to the power supply voltage terminal GV and discharges the charge unit 420 in response to the initialization signal INT.

The holding unit 460 includes a plurality of transistors T3, T5, T7, T8, T10, T11, T12, and T13. When the gate signal Gout(j) is changed from a low level to a high level, the holding unit 460 maintains the high level. When the gate signal Gout (j) is changed from a high level to a low level, the holding unit 460 maintains the gate signal Gout(j) at a low level for one frame, regardless of the voltage levels of the first clock signal CKV and the second clock signal CKVB.

Next, a process of supplying gate signals will be described in detail with reference to FIGS. 3A and 3B.

The previous carry signal Cout(j−1) is supplied to the capacitor C1 of the charge unit 420 to charge the capacitor C1. At that time, the voltage of the first node N1 is gradually increased. When the first clock signal CKV changed from a low level to a high level is input, the voltage of the first node N1 is increased again by the parasitic capacitor Cgd of the first node N1 and the transistor T1.

When the voltage of the charge unit 420, that is, the voltage of the first node N1 is increased to a first charge level, the transistor T1 of the pull-up unit 430 is turned on, and the first clock signal CKV input through the first clock terminal CK1 is supplied as the gate signal Gout(j) through the gate output terminal OUT1.

A ripple may occur in the first node N1 due to the parasitic capacitor Cgd. In this case, in order to prevent errors due to the ripple, the thin film transistors T10 and T11 of the holding unit 460 are turned on.

When the channel width of the thin film transistor T10 is increased to improve the driving performance of the thin film transistor T10, the driving margin of the thin film transistor T1 of the pull-up unit 430 is reduced. As such, the trade-off relationship is established between the driving performance of the thin film transistor T10 of the holding unit 460 and the driving performance of the thin film transistor T1 of the pull-up unit 430. Therefore, even when there is a difference in process conditions between the thin film transistor T10 of the holding unit 460 and the thin film transistor T1 of the pull-up unit 430 during a manufacturing process, the driving performances of the two thin film transistors T1 and T10 need to be balanced with each other all the time. A structure and a manufacturing method of balancing the driving performances of the two thin film transistors T1 and T10 all the time will be described below.

Figure 4:
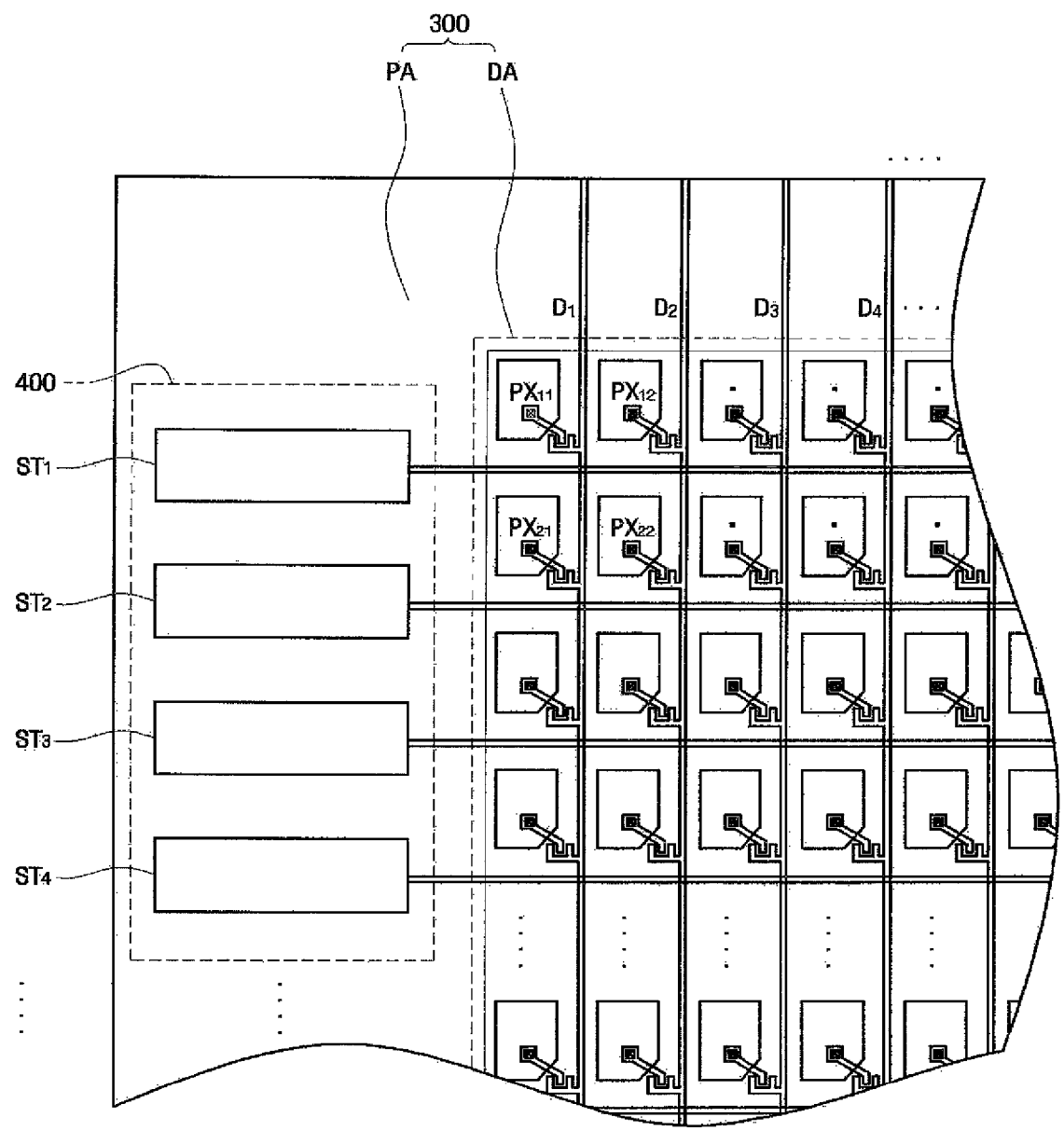
FIG. 4 is layout view illustrating the thin film transistor substrate shown in FIG. 1.
Figure 5:
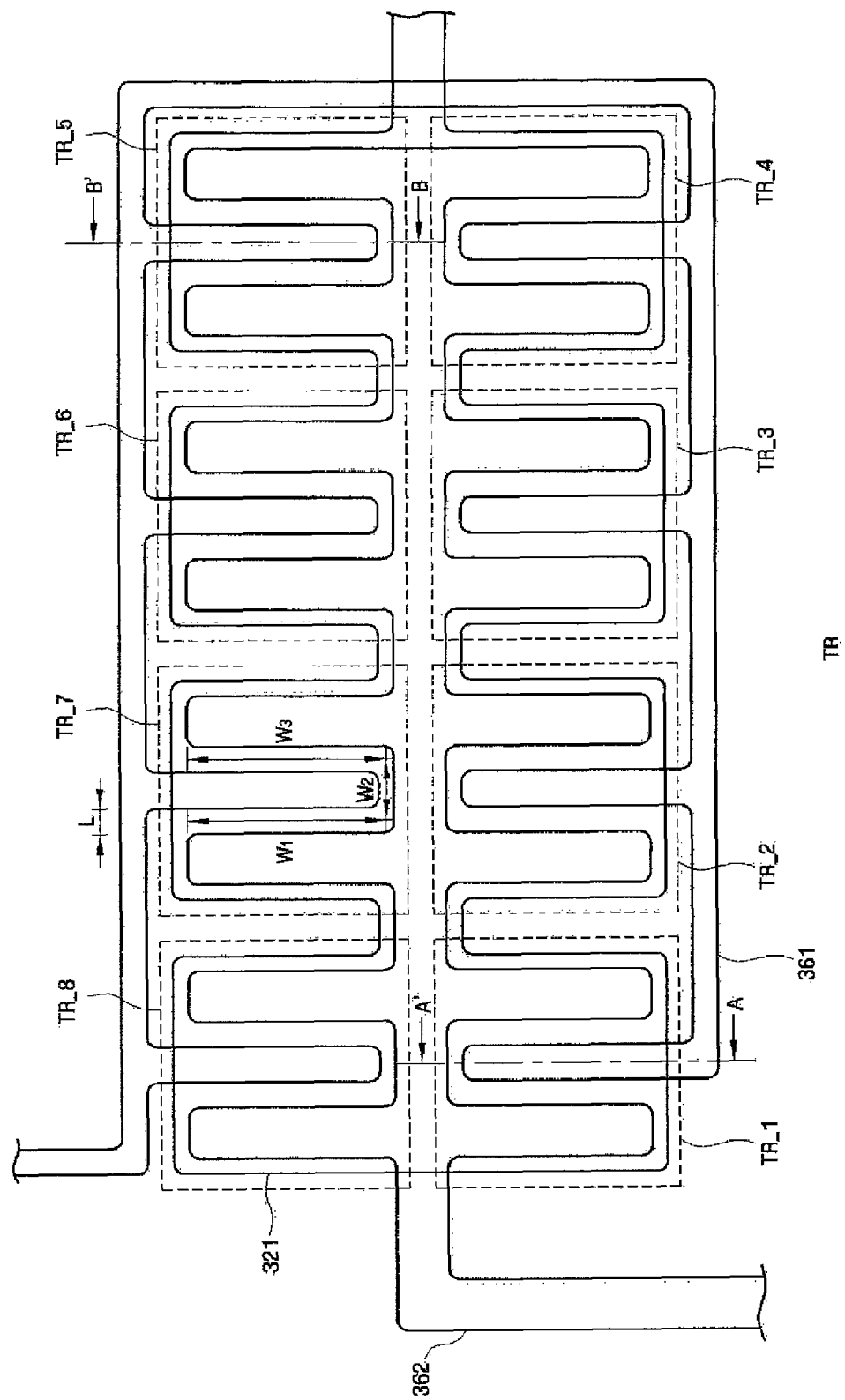
FIG. 5 is a diagram illustrating the arrangement of thin film transistors shown in FIG. 4.
Figure 6A:
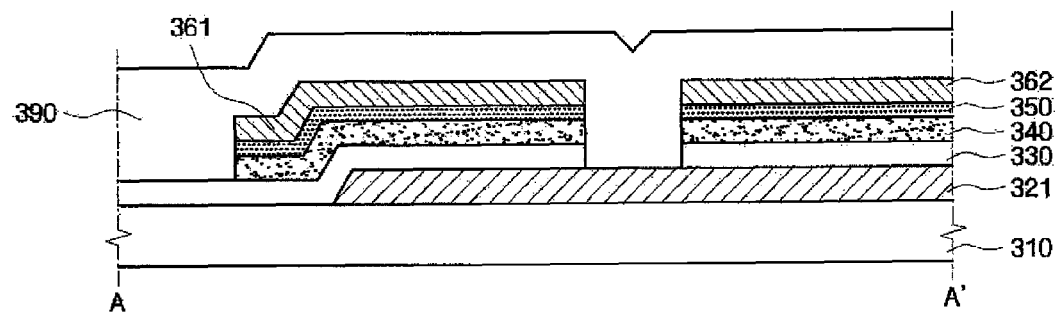
FIG. 6A is a cross-sectional view illustrating an over-exposed thin film transistor taken along the line A-A' of FIG. 5.
Figure 6B:
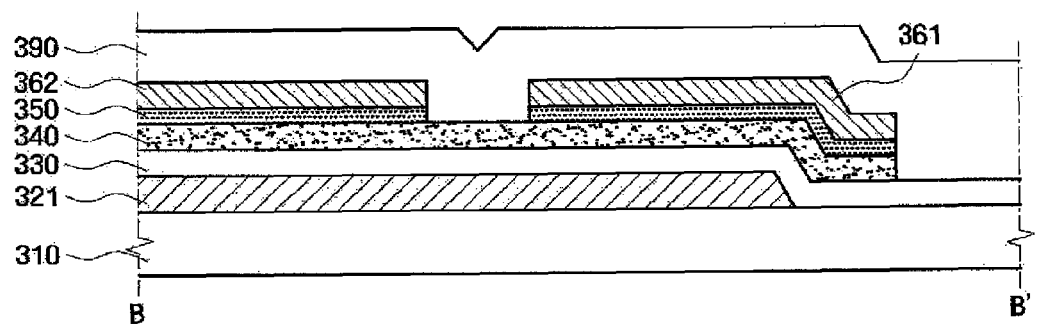
FIG. 6B is a cross-sectional view illustrating the over-exposed thin film transistor taken along the line B-B' of FIG. 5.

Next, the thin film transistors included in the gate driver will be described in detail with reference to FIGS. 4 to 6B. FIG. 4 is a layout view illustrating the thin film transistor substrate shown in FIG. 1. FIG. 5 is a diagram illustrating the arrangement of the thin film transistors shown in FIG. 4. FIG. 6A is a cross-sectional view illustrating the over-exposed thin film transistor taken along the line A-A' of FIG. 5, and FIG. 6B is a cross-sectional view illustrating the over-exposed thin film transistor taken along the line B-B' of FIG. 5.

As described above, the display panel 300 is divided into the display area DA in which images are displayed and the non-display area PA in which no image is displayed. In the display area DA, a plurality of pixels PX11 to PXmn (not shown) are arranged in a matrix, and each of the pixels PX11 to PXmn is controlled by a switching element composed of a thin film transistor. An amorphous thin film transistor formed of amorphous silicon may be used as the thin film transistor that controls each of the pixels PX11 to PXmn. The amorphous thin film transistor is advantageous to control the pixels PX11 to PXmn, because it has a small leakage current.

The non-display area PA surrounding the display area DA does not display any image, and has the gate driver 400 mounted therein. As described above, the gate driver 400 includes the stages ST1 to STn connected to one another in a cascade manner.

The gate driver 400 may be mounted to the thin film transistor substrate. The gate driver 400 includes a plurality of stages ST1 to STn, and it may be formed in the non-display area PA on the extension lines of the gate lines G1 to Gn. Each of the stages ST1 to STn includes a plurality of thin film transistors.

Next, the structure of each of the thin film transistors included in each state will be described in detail with reference to FIGS. 5 to 6B.

The thin film transistor TR includes a source electrode 361 and a drain electrode 362. The source electrode 361 and the drain electrode 362 are arranged with a predetermined gap therebetween where a channel is formed. In order to increase the width of the channel, the source and drain electrodes are formed in uneven shapes. A pair of the source electrode 361 and the drain electrode 362 having uneven shapes may form one unit thin film transistor (TR_1 to TR_8). That is, the thin film transistor TR may include a plurality of unit thin film transistors TR_1 to TR_8 having the gate electrodes 321, the source electrodes 361, and the drain electrodes 362 connected to each other. The thin film transistor TR including a plurality of unit thin film transistors TR_1 to TR_8 makes it possible to maximize the width of the channel.

One thin film transistor TR, however, does not necessarily need to include a plurality of unit thin film transistors TR_1 to TR_8. The thin film transistor TR and the unit thin film transistors TR_1 to TR_8 are similar to each other in that they are three-terminal switching elements including the gate electrode 321, the source electrode 361, and the drain electrode 362, and the thin film transistor TR is not necessarily discriminated from the unit thin film transistors TR_1 to TR_8. That is, a new term "unit thin film transistor" is defined in that the unit thin film transistor is an uneven portion formed in order to increase the channel width of the thin film transistor, but each unit thin film transistor can serve on its own as an independent switching element. Therefore, the meaning of the thin film transistor is discriminated from that of the unit thin film transistor for convenience of description, but they may have the same meaning, if necessary. In the following, the thin film transistor may be the unit thin film transistor.

The term "channel" means a path that is formed between the source electrode 361 and the drain electrode 362 for the movement of charge in response to the gate signal Gout(j) supplied to the gate electrode 321. The length L of the channel means the vertical length L between the source electrode 361 and the drain electrode 362, and the width W (not shown) of the channel means the total width of the center lines of the channels maintained in parallel to the source electrode 361 and the drain electrode 362.

The channel width (W/n) of the unit thin film transistors TR_1 to TR_8 is the sum of the widths of the channels formed along the outside of the source electrode 361, that is, W1+W2+W3. That is, the channel width W is a value obtained by multiplying the channel width of one unit thin film transistor (W/n=W1+W2+W3) by the number of unit thin film transistors (n) (W=W/n×n). In the thin film transistor including a plurality of unit thin film transistors TR_1 to TR_8, the value W/L (the width W of the channel/the length L of the channel) is an important factor determining the performance of a transistor.

Next, with reference to FIGS. 6A and 6B, the structure of the thin film transistor TR will be described in detail.

The gate electrode 321 is formed on an insulating substrate 310 made of, for example, transparent glass. The gate electrode 321 is formed in an uneven shape, and the unit thin film transistors TR1_1 to TR_8 are formed in convex shapes. The gate electrode 321 may be made of, for example, an aluminum-based metal material, such as aluminum (Al) or aluminum alloy, a silver-based metal material, such as silver (Ag) or silver alloy, a copper-based metal material, such as copper (Cu) or copper alloy, a molybdenum-based metal material, such as molybdenum (Mo) or molybdenum alloy, chrome (Cr), titanium (Ti), or tantalum (Ta). The gate electrode 321 may have a multi-layer structure including two conductive films (not shown) having different physical properties.

A gate insulating film 330 made of, for example, silicon nitride (SiNx) is formed on the gate electrode 321.

A semiconductor layer 340 made of, for example, hydrogenated amorphous silicon or polycrystalline silicon is formed on the gate insulating film 330. An ohmic contact layer 350 made of, for example, silicide or n+ hydrogenated amorphous silicon that is highly doped with n-type impurities is formed on the semiconductor layer 340. A pair of ohmic contact layers 350 may be formed on the semiconductor layer 340.

The source electrode 361 and the drain electrode 362 are formed on the ohmic contact layer 350 and the gate insulating film 330. The source electrode 361 and the drain electrode 362 overlap at least a portion of the semiconductor layer 340, and are coupled in an uneven shape on the gate electrode 321. The source electrode 361 and the drain electrode 362 are formed with a predetermined gap therebetween on the gate electrode 321 and the semiconductor layer 340. As described above, the gap between the source electrode 361 and the drain electrode 362 serves as a channel.

Some of the unit thin film transistors TR_1 to TR_8 included in the thin film transistor TR may be dummy thin film transistors that do not have a switching function. That is, as shown in FIG. 6A, the channel of the unit thin film transistor TR_1 may be removed. When the semiconductor layer 340 forming the channel of the unit thin film transistor TR_1 is removed, the unit thin film transistor TR_1 cannot perform a switching operation.

Some of the unit thin film transistors TR_1 to TR_8 of the thin film transistor TR may have a switching function, however, like the unit thin film transistor shown in FIG. 6B. The structure in which the unit thin film transistor TR_1 included in the thin film transistor TR is a dummy thin film transistor may be applied to the transistor T1 of the pull-up unit (430 of FIG. 3A) of the gate driver (400 of FIG. 1) and the transistor T10 of the holding unit (460 of FIG. 3A). If necessary, a portion of one thin film transistor or one stage may be a dummy thin film transistor. In an exemplary embodiment, 20 to 60% of unit thin film transistors in one thin film transistor may be dummy thin film transistors.

Next, a method of manufacturing a thin film transistor substrate according to an exemplary embodiment of the present invention will be described with reference to FIGS. 5 to 14B. FIGS. 7A to 14B are cross-sectional views illustrating over-exposure in the method of manufacturing the thin film transistor substrate according to an exemplary embodiment of the present invention.

Figure 7A:
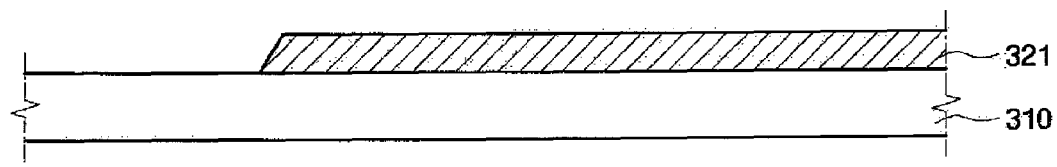
FIGS. 7A to 14B are cross-sectional views illustrating over-exposure in a method of manufacturing the thin film transistor substrate according to an exemplary embodiment of the present invention.
Figure 7B:
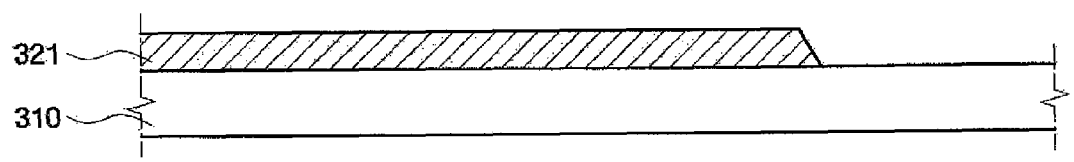

First, as shown in FIGS. 7A and 7B, a gate wiring metal film (not shown) is formed on the insulating substrate 310 and then patterned to form the gate electrode 321. The gate wiring metal film may be formed by, for example, sputtering. Wet etching or dry etching may be used to pattern the gate electrode 321. In the case of wet etching, an etchant, such as phosphoric acid, nitric acid, or acetic acid, may be used. In the case of dry etching, a chlorine-based etching gas, such as $Cl_2$ or $BCl_3$, may be used. When the dry etching is performed on the gate wiring multi-layer metal film, it is possible to more minutely pattern the gate wiring lines, because dry etching is an anisotropic etching.

Figure 8A:
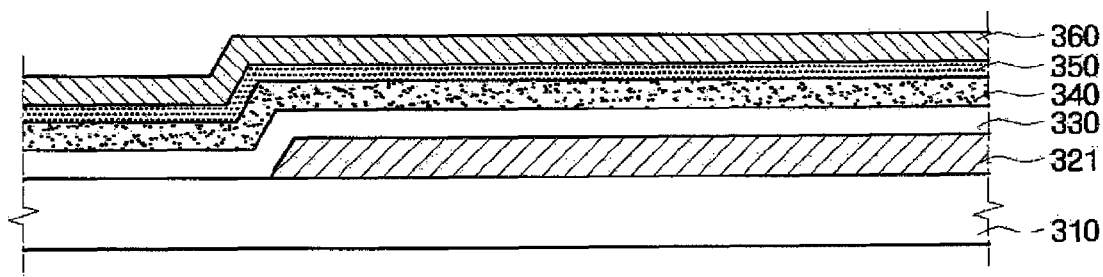
Figure 8B:
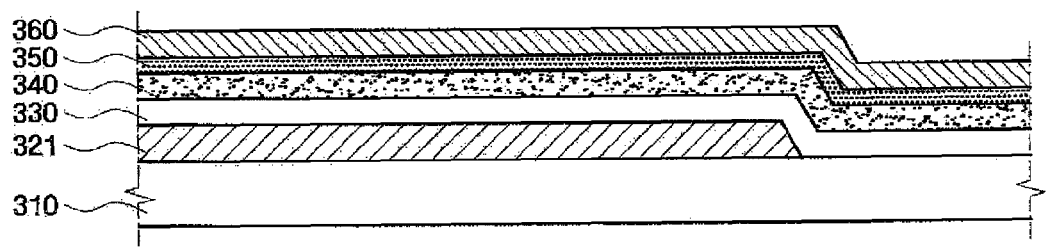

Then, as shown in FIGS. 8A and 8B, the gate insulating film 330 is formed on the insulating substrate 310 and the gate electrode 321 by, for example, plasma enhanced CVD, PECVD or reactive sputtering.

Then, the semiconductor layer 340 and the data wiring conductive film 360 are sequentially formed on the gate insulating film 330 by, for example, sputtering.

Figure 9A:
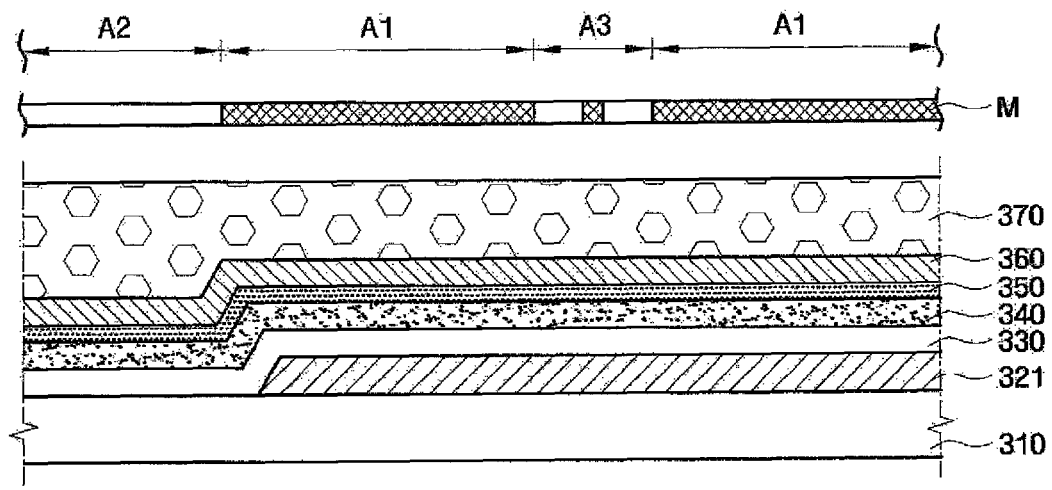
Figure 9B:
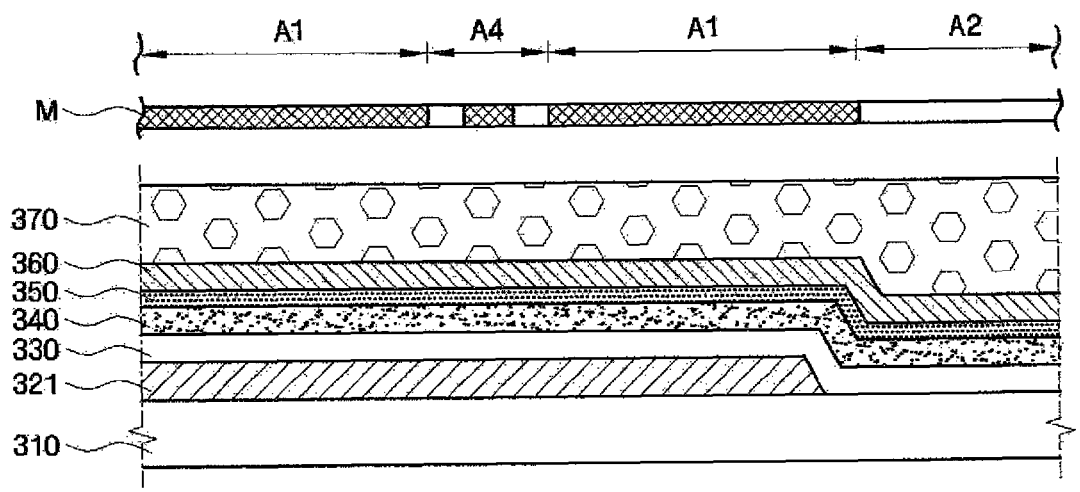
Figure 10A:
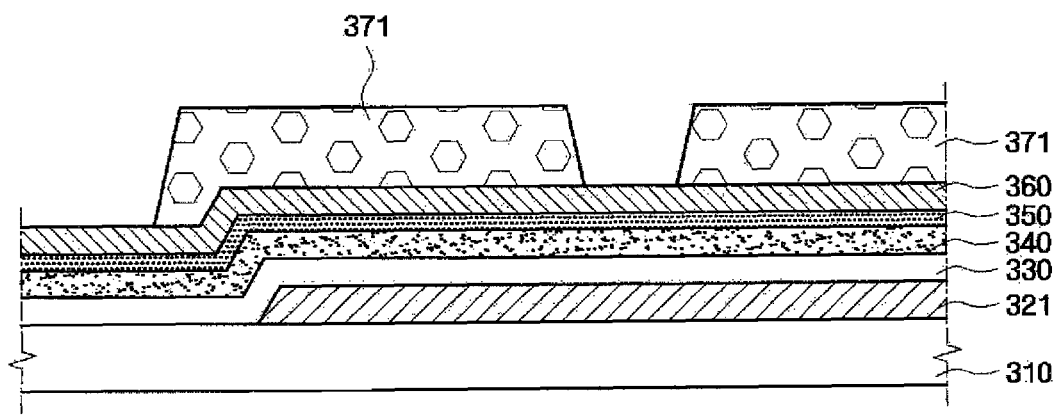
Figure 10B:
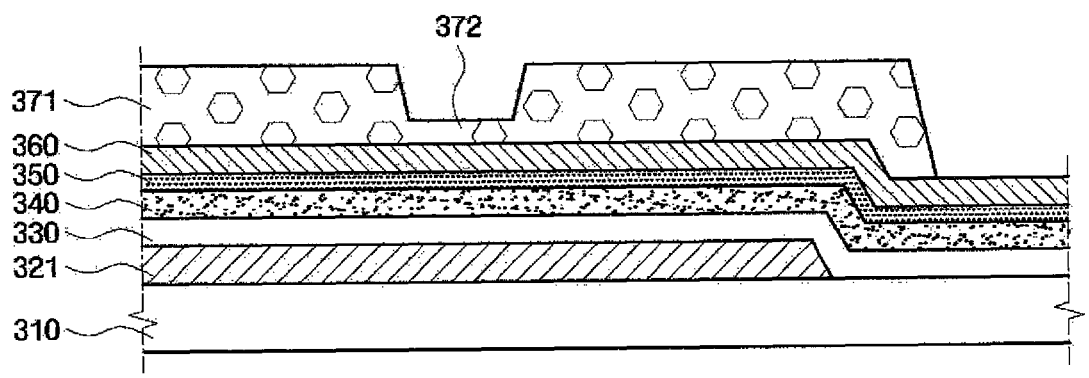

Subsequently, referring to FIGS. 9A and 9B, a photoresist layer 370 is formed on the data wiring conductive film 360. Then, light is radiated to the photoresist layer 370 through a mask M. The mask M includes a transmissive region A2 that transmits light, a light-shielding region A1 that shields light, and first and second transflective regions A4 and A3 that partially transmit light.

The first transflective region A4 and the second transflective region A3 are formed at both sides of the light-shielding region A1 so as to overlap a channel forming region. The first transflective region A4 and the second transflective region A3 partially transmit light, and the reflectance of the second transflective region A3 may be lower than that of the first transflective region A4. The first transflective region A4 and the second transflective region A3 may use a slit, a lattice-shaped pattern, or a mask using a transflective film in order to adjust the transmittance of light.

Then, referring to FIGS. 9A to 10B, after light is radiated to the photoresist layer through the mask M, the photoresist layer is developed to form photoresist patterns 371 and 372. At that time, a portion of the photoresist layer 370 overlapping the transmissive region A2 is removed. In a third region in which the photoresist layer 370 overlaps the light-shielding region A1, the photoresist layer 370 remains as the photoresist pattern 371.

In the first and second regions respectively overlapping the first transflective region A4 and the second transflective region A3, the photoresist layer 370 is removed or remains as the photoresist pattern 372 depending on the amount of light radiated. When a large amount of light is radiated to the photoresist layer through the mask M, the photoresist layer 370 in the second region is completely removed, and a portion of the photoresist layer 370 in the first region remains to form a thin photoresist pattern 372. That is, the thickness of the third region may be larger than that of the second region.

The channel of the thin film transistor is formed in the first region, and the second region overlaps the semiconductor layer without the dummy thin film transistor.

Figure 11A:
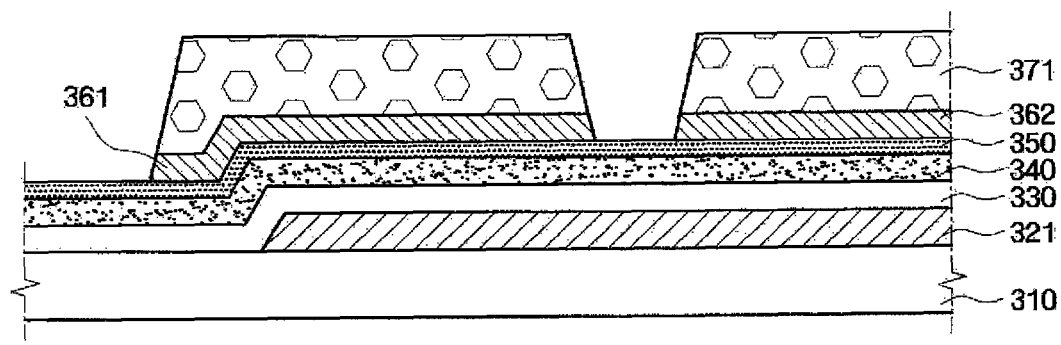
Figure 11B:
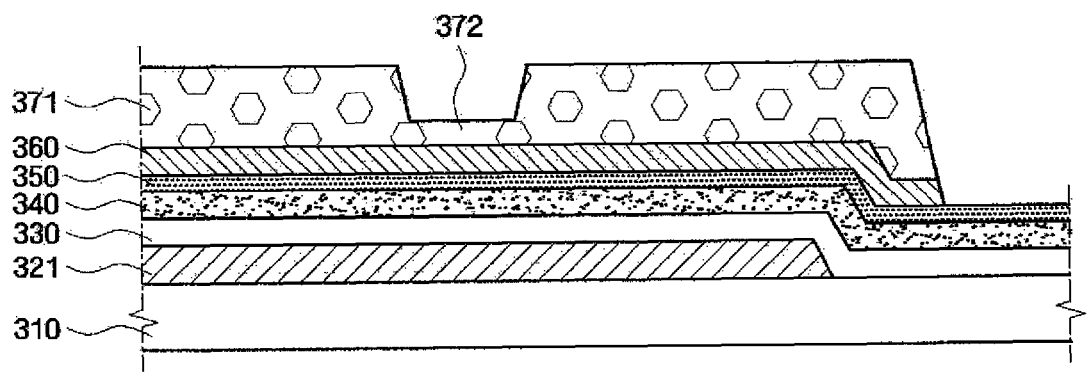

Then, referring to FIGS. 11A and 11B, the data wiring conductive film 360 is etched using the photoresist patterns 371 and 372 as an etching mask. In this case, either wet etching or dry etching may be used. In the case of wet etching, an etchant, such as a mixed liquid of phosphoric acid, nitric acid, and acetic acid, or a mixed liquid of hydrofluoric acid (HF) and deionized water, may be used. In the case of dry etching, a fluorine-based etching gas or a chlorine-based etching gas may be used. Examples of the fluorine-based etching gas include $SF_6$, $CF_4$, $XeF_2$, $BrF_2$, and $ClF_2$, and examples of the chlorine-based etching gas include $Cl_2$, $BCl_3$, and $HCl$. For example, when dry etching is performed on the data wiring conductive film 360, it is possible to more minutely pattern data wiring lines, because dry etching is an anisotropic etching.

Figure 12A:
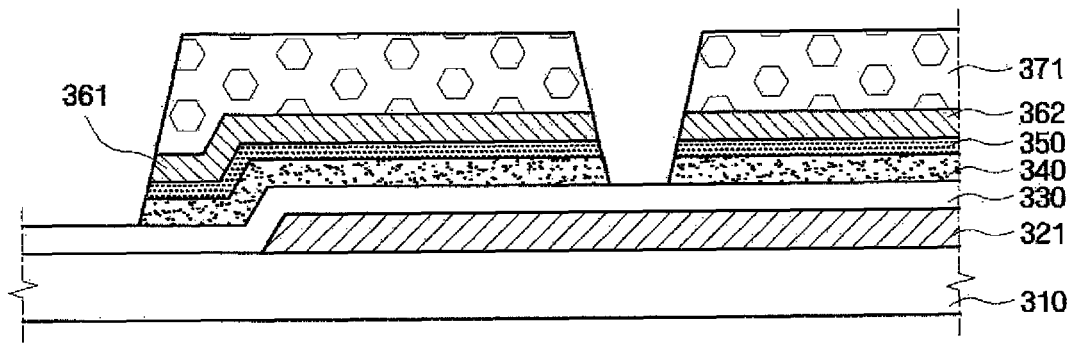
Figure 12B:
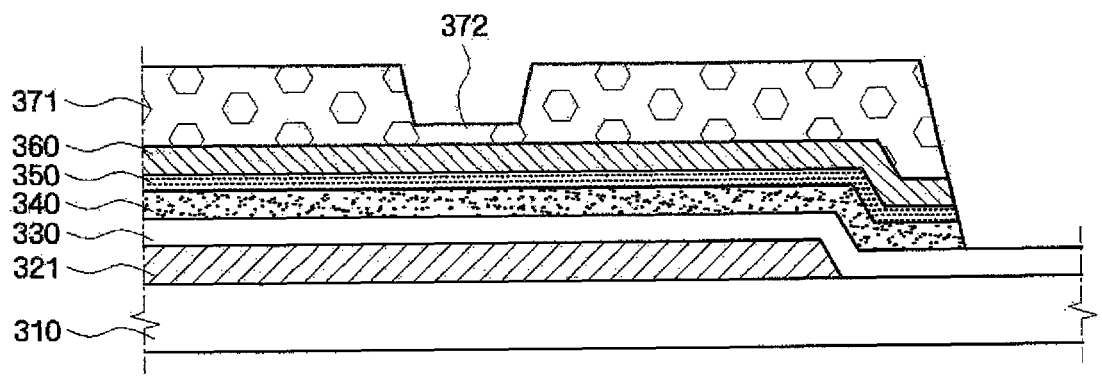
Figure 13A:
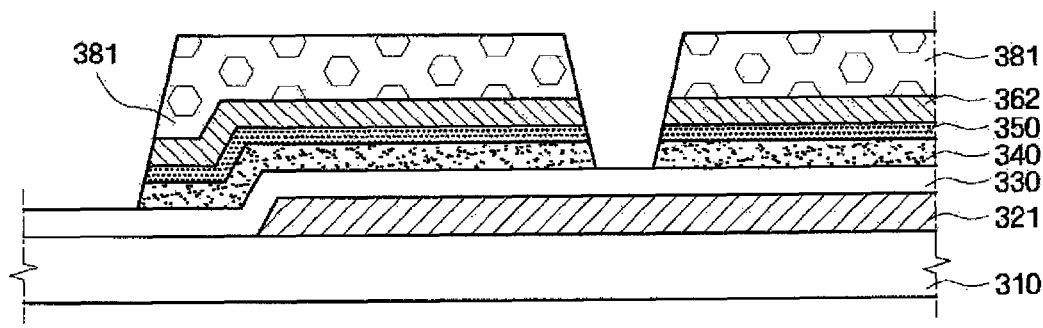
Figure 13B:
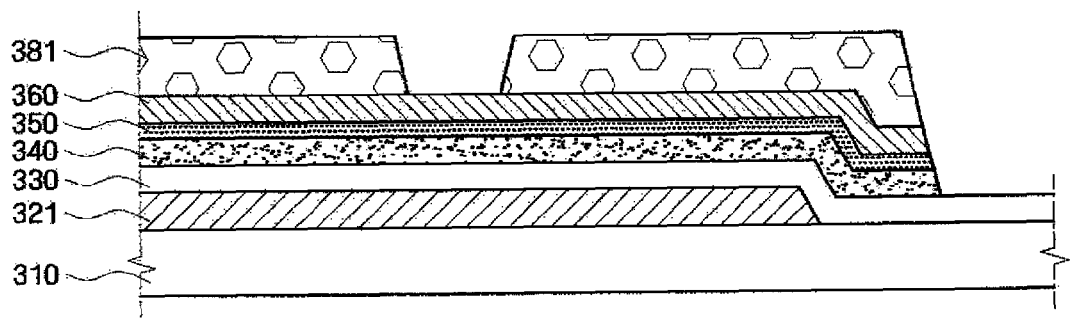

Then, referring to FIGS. 12A and 12B, the semiconductor layer 340 is etched using the photoresist patterns 371 and 372 as an etching mask. In this exemplary embodiment, the semiconductor layer 340 be etched, but the gate insulating film 330 need not be etched.

The data wiring conductive film 360 and the oxide semiconductor layer 340 may be collectively patterned by wet etching.

Then, referring to FIGS. 12A to 13B, the photoresist patterns 371 and 372 are etched back to remove the photoresist pattern 372 in the channel region. At that time, the overall thickness of the photoresist pattern 381 is reduced.

Figure 14A:
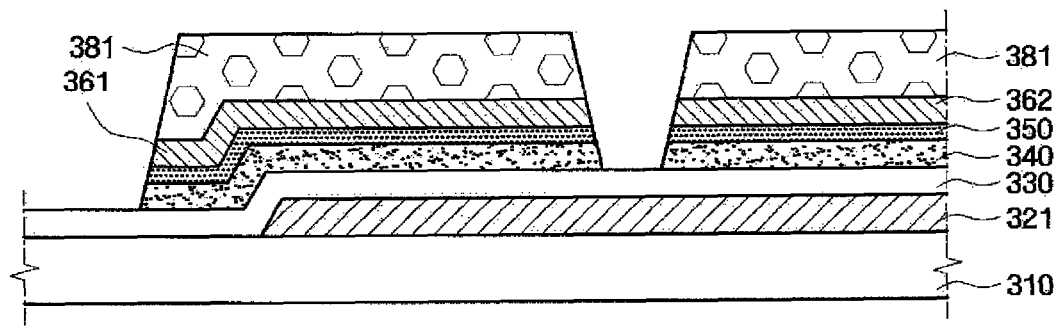
Figure 14B:
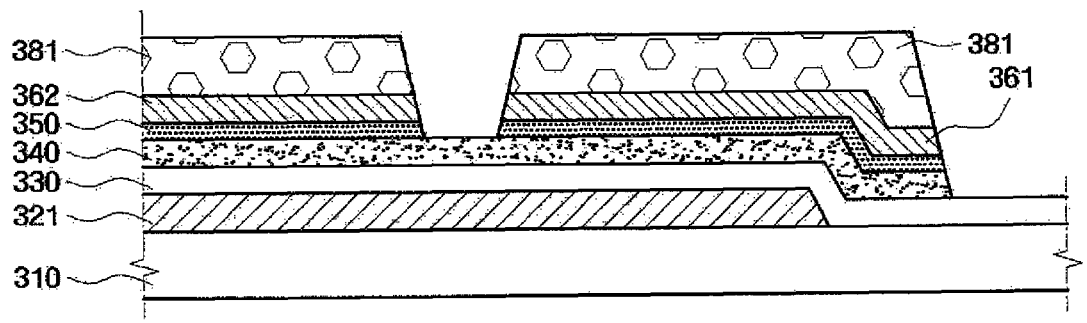

Then, as shown in FIGS. 14A and 14B, the data wiring conductive film pattern 360 in the channel region is removed by wet etching or dry etching. In the case of wet etching, an etchant, such as a mixed liquid of phosphoric acid, nitric acid, and acetic acid, or a mixed liquid of hydrofluoric acid (HF) and deionized water, may be used. In the case of dry etching, a fluorine-based etching gas or a chlorine-based etching gas may be used. Examples of the fluorine-based etching gas include $SF_6$, $CF_4$, $XeF_2$, $BrF_2$, and $ClF_2$, and examples of the chlorine-based etching gas include $Cl_2$, $BCl_3$, and $HCl$. Additionally a portion of the ohmic contact layer 350 may be removed.

Finally, the photoresist pattern 381 is removed from the structure shown in FIGS. 14A and 14B, and a protective film 390 is formed on the structure to complete the thin film transistor shown in FIGS. 6A and 6B.

Figure 15A:
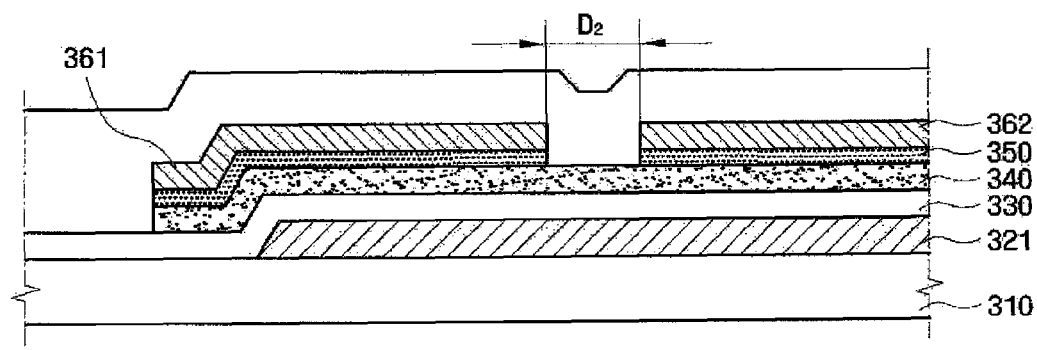
FIG. 15A is a cross-sectional view illustrating a normally exposed thin film transistor taken along the line A-A' of FIG. 5.
Figure 15B:
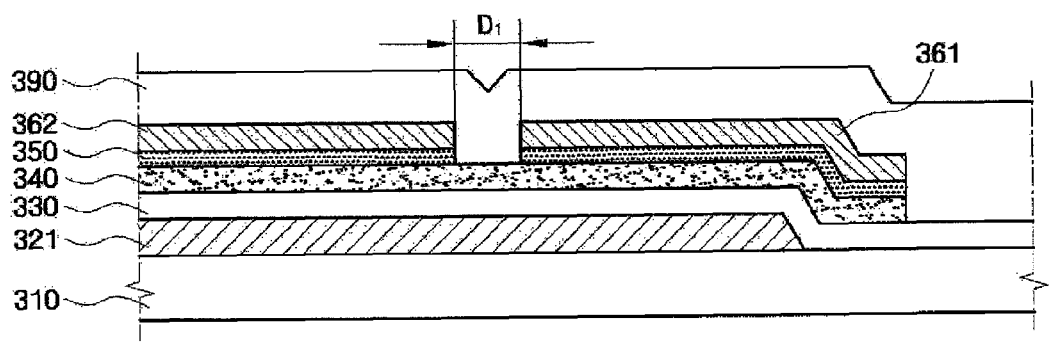
FIG. 15B is a cross-sectional view illustrating a normally exposed thin film transistor taken along the line B-B' of FIG. 5.
Figure 16A:
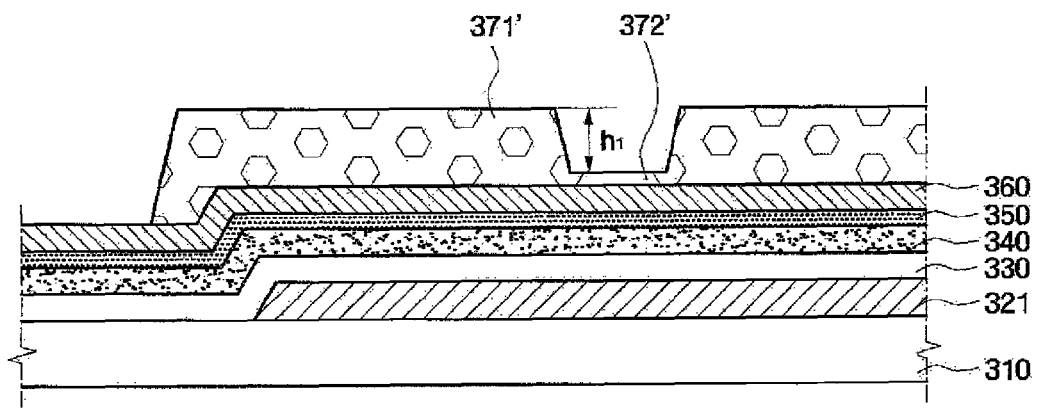
FIGS. 16A to 20B are cross-sectional views illustrating normal exposure in the method of manufacturing the thin film transistor substrate according to an exemplary embodiment of the present invention.
Figure 16B:
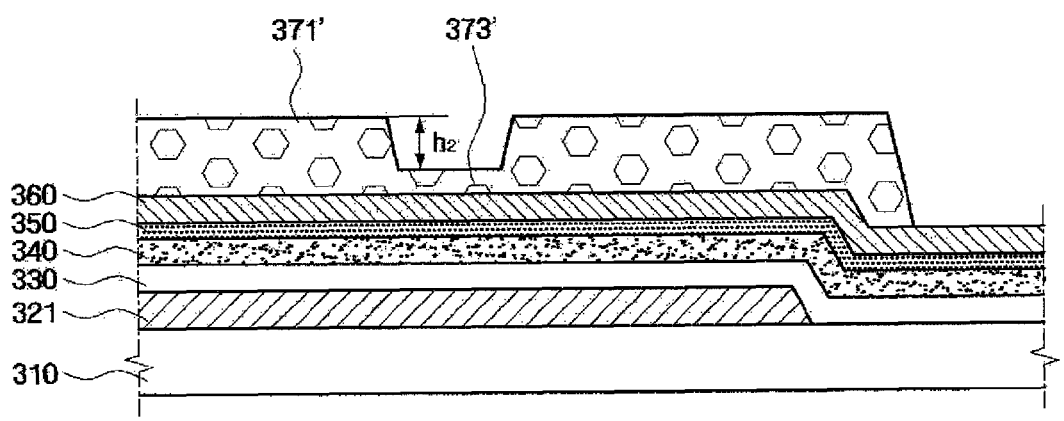

Next, a normally exposed thin film transistor will be described with reference to FIGS. 15A and 15B. FIG. 15A is a cross-sectional view illustrating a normally exposed thin film transistor taken along the line A-A' of FIG. 5, and FIG. 15B is a cross-sectional view illustrating a normally exposed thin film transistor taken along the line B-B' of FIG. 5. For convenience of description, the same components as those of the thin film transistor shown in FIGS. 6A and 6B are denoted by the same reference numerals, and a description thereof will be omitted.

A normally exposed thin film transistor TR does not include a dummy thin film transistor, but includes only the unit thin film transistors that can normally perform a switching operation. Specifically, each of the unit thin film transistors TR_1 to TR_8 includes the gate electrode 321 formed on the insulating substrate 310, and the gate insulating film 330 is formed on the gate electrode 321.

The semiconductor layer 340 and the ohmic contact layer 350 are formed on the gate insulating film 330.

The source electrode 361 and the drain electrode 362 are formed on the ohmic contact layer 350 and the gate insulating film 330. The source electrode 361 and the drain electrode 362 overlap at least a portion of the semiconductor layer 340, and are coupled in an uneven shape on the gate electrode 321. The source electrode 361 and the drain electrode 362 are formed with a predetermined gap therebetween on the gate electrode 321 and the semiconductor layer 340. As described above, the gap between the source electrode 361 and the drain electrode 362 serves as a channel.

In this exemplary embodiment, the unit thin film transistors may be formed so as to have different channel lengths. For example, the length $D_2$ of the channel of the unit thin film transistor TR_1 shown in FIG. 15A may be larger than the length $D_1$ of the channel of the unit thin film transistor TR_5 shown in FIG. 15B. The unit thin film transistor TR_1 shown in FIG. 15A having a channel length that is larger than that of the unit thin film transistor TR_5 shown in FIG. 15B may have a driving performance that is lower than that of the unit thin film transistor TR_5.

Next, a method of manufacturing the unit thin film transistors shown in FIGS. 15A and 15B will be described with reference to FIGS. 7A to 9B and FIGS. 16A to 20B. FIGS. 16A to 20B are cross-sectional views illustrating normal exposure in a method of manufacturing a thin film transistor substrate according to an exemplary embodiment of the present invention.

The manufacturing processes shown in FIGS. 7A to 9B are the same as described above, and a description thereof will be omitted.

Referring to FIGS. 9A, 9B, 16A, and 16B, after light is radiated to the photoresist layer through the mask M, the photoresist layer is developed to form photoresist patterns 371', 372', and 373'. At that time, a portion of the photoresist layer 370 overlapping the transmissive region A2 is removed. In a third region overlapping the light-shielding region A1, the photoresist layer 370 remains as the photoresist pattern 371'.

In the first and second regions respectively overlapping the first transflective region 373' and the second transflective region 372', the thicknesses of the photoresist layer 370 are different from each other depending on the amount of light radiated. That is, when light is normally radiated to the photoresist layer through the mask M, the photoresist layer 370 remains in the first region and the second region as the photoresist patterns 372' and 373'. In this case, the photoresist pattern 372' in the second region is thicker than the photoresist pattern 373' in the first region. That is, because the second transflective region A3 has a transmittance that is higher than that of the first transflective region A4, the depth $h_1$ of the photoresist pattern 372' in the second region is larger than the depth $h_2$ of the photoresist pattern 373' in the first region.

Figure 17A:
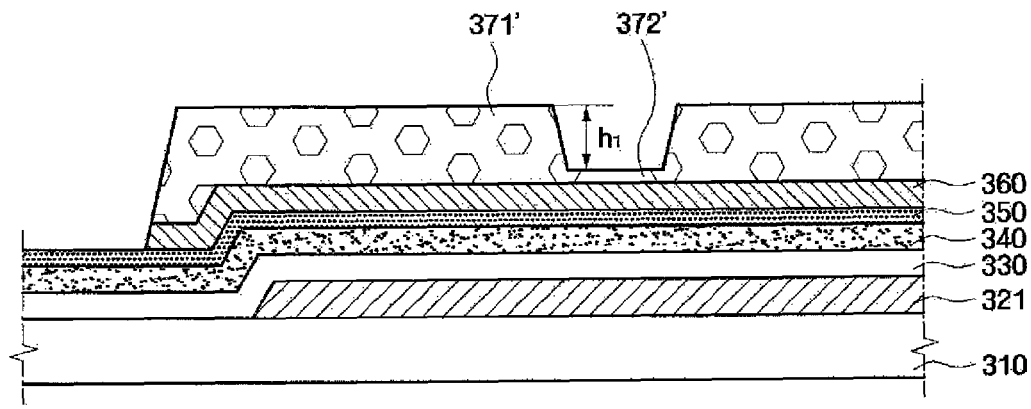
Figure 17B:
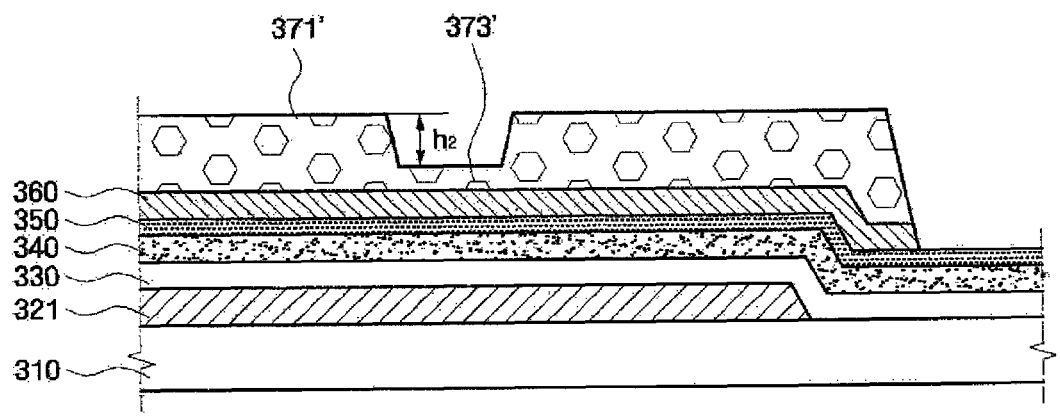

Then, referring to FIGS. 17A and 17B, the data wiring conductive film 360 is etched using the photoresist patterns 371', 372', and 373' as an etching mask. In this case, wet etching or dry etching may be used.

Figure 18A:
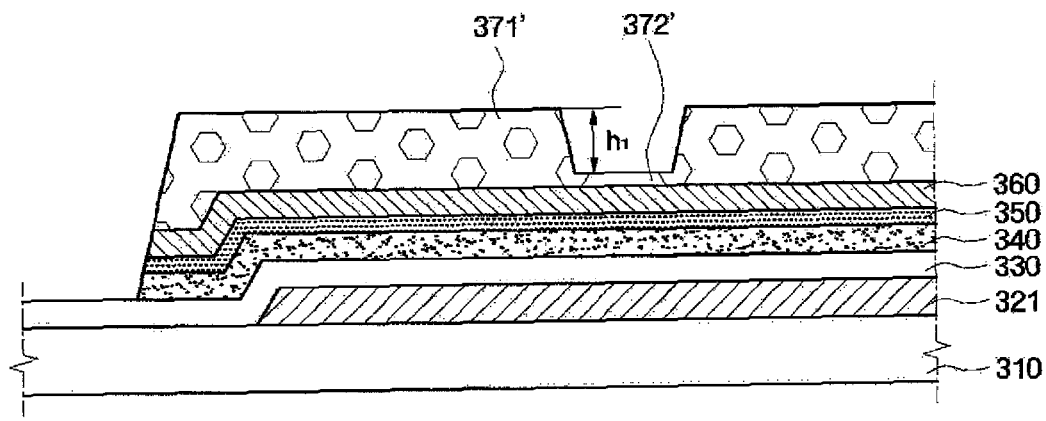
Figure 18B:
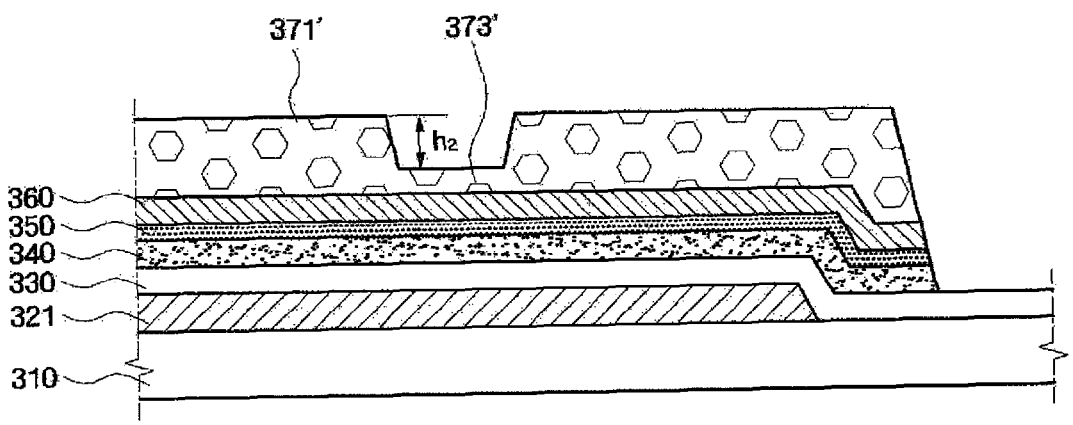

Then, referring to FIGS. 18A and 18B, the semiconductor layer 340 is etched using the photoresist patterns 371', 372', and 373' as an etching mask. In this case, it is preferable that the semiconductor layer 340 be etched, but the gate insulating film 330 be not etched.

The data wiring conductive film 360 and the oxide semiconductor layer 340 may be collectively patterned by wet etching.

Figure 19A:
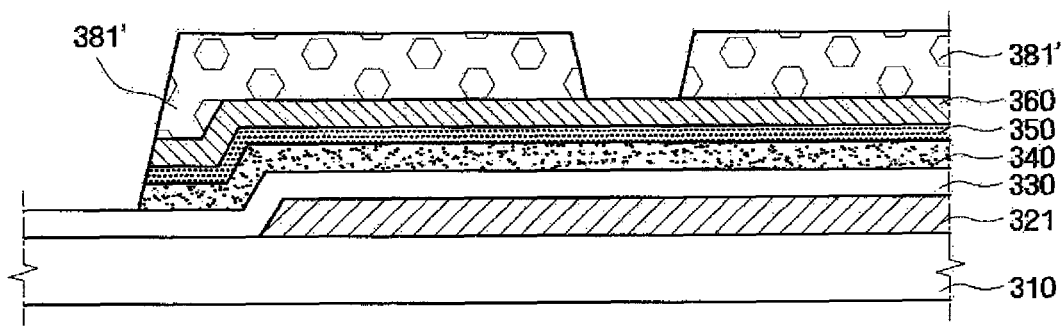
Figure 19B:
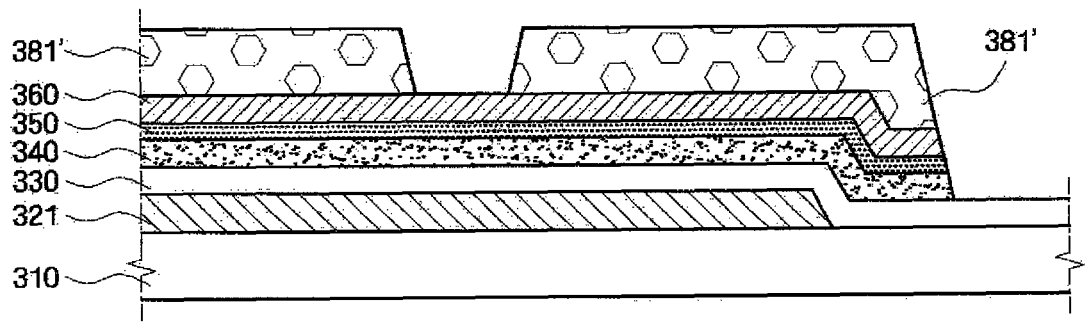

Then, referring to FIGS. 19A to 19B, the photoresist patterns 371', 372', and 373' are etched back to remove the photoresist patterns 372' and 373' in the channel region. At that time, the overall thickness of the photoresist pattern 381' is reduced.

Figure 20A:
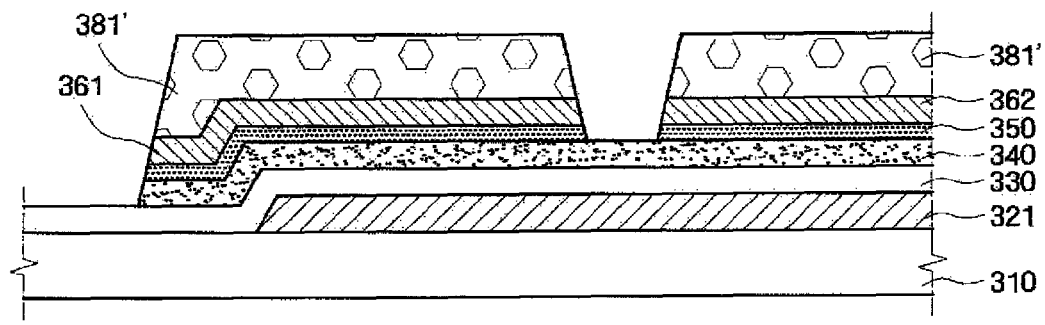
Figure 20B:
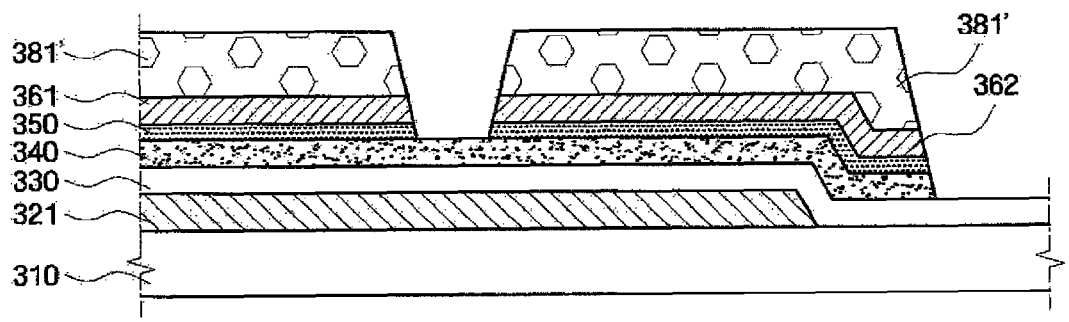

Then, as shown in FIGS. 20A and 20B, the data wiring conductive film pattern 360 in the channel region is removed by wet etching or dry etching. Additionally, a portion of the ohmic contact layer 350 may be removed.

Finally, the photoresist pattern 381' is removed from the structure shown in FIGS. 20A and 20B, and a protective film 390 is formed on the structure to complete the thin film transistor shown in FIGS. 15A and 15B.

Figure 21:
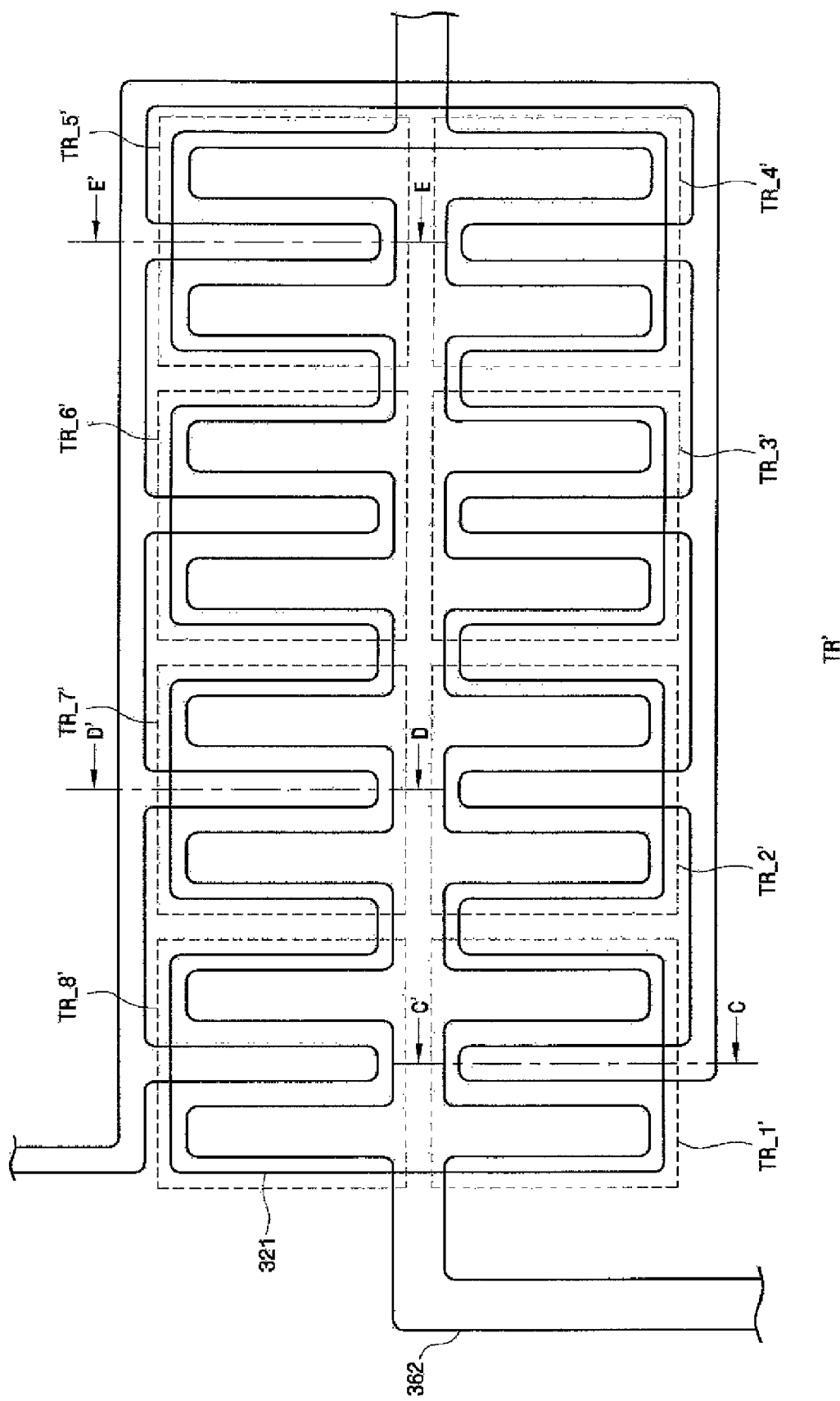
FIG. 21 is a diagram illustrating the arrangement of thin film transistors included in a thin film transistor substrate according to an exemplary embodiment of the present invention.
Figure 22A:
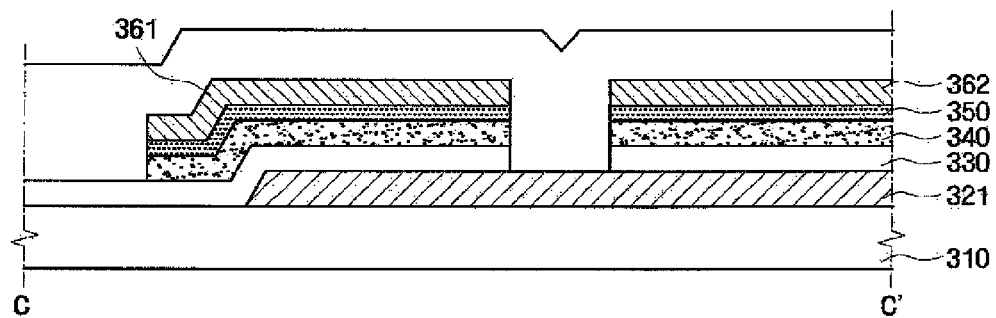
FIG. 22A is a cross-sectional view illustrating the thin film transistor taken along the line C-C' of FIG. 21.
Figure 22B:
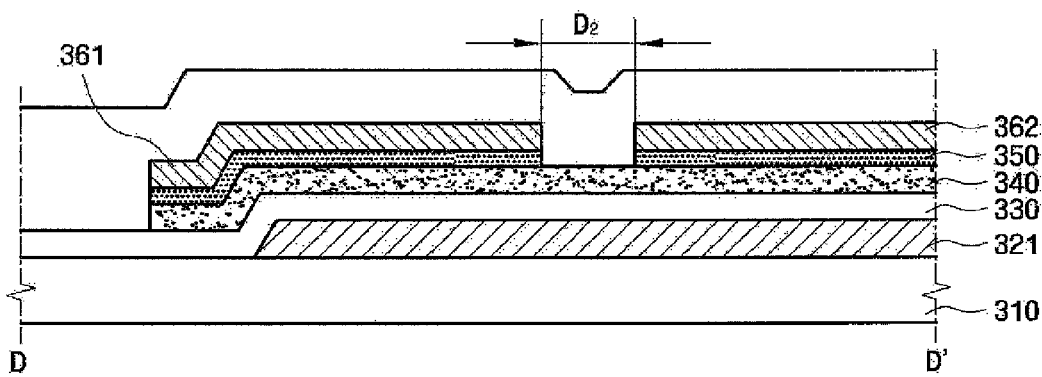
FIG. 22B is a cross-sectional view illustrating the thin film transistor taken along the line D-D' of FIG. 21.
Figure 22C:
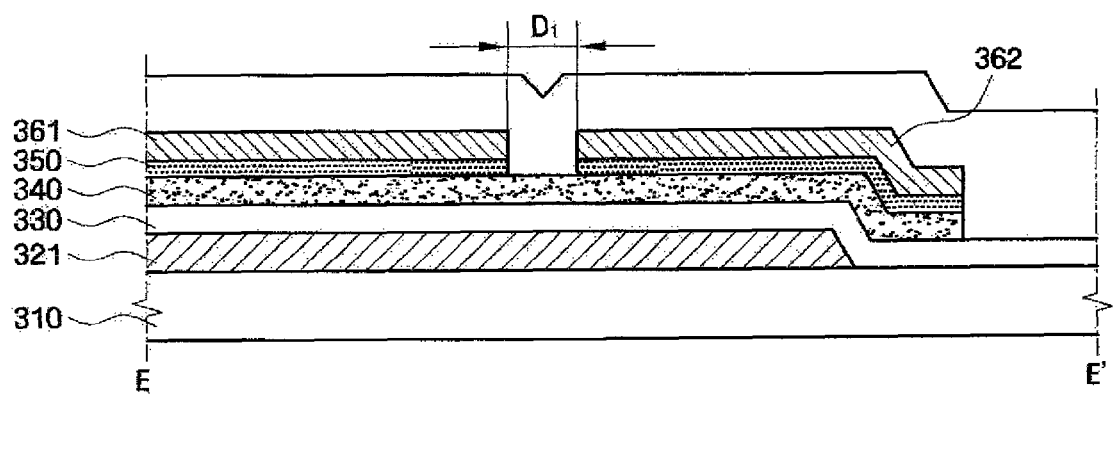
FIG. 22C is a cross-sectional view illustrating the thin film transistor taken along the line E-E' of FIG. 21.

Next, a thin film transistor included in a thin film transistor substrate according to an exemplary embodiment of the present invention will be described with reference to FIGS. 21 to 22C. FIG. 21 is a diagram illustrating the arrangement of the thin film transistors included in the thin film transistor substrate according to an exemplary embodiment of the present invention. FIG. 22A is a cross-sectional view illustrating the thin film transistor taken along the line C-C' of FIG. 21, FIG. 22B is a cross-sectional view illustrating the thin film transistor taken along the line D-D' of FIG. 21, and FIG. 22C is a cross-sectional view illustrating the thin film transistor taken along the line E-E' of FIG. 21. For convenience of description, the same components as those in the above described exemplary embodiment are denoted by the same reference numerals, and a description thereof will be omitted.

The thin film transistor TR' shown in FIG. 21 included in the thin film transistor substrate according to an exemplary embodiment of the present invention includes a dummy thin film transistor TR_1' and unit thin film transistors TR_5' and TR_7' having different channel lengths.

In the dummy thin film transistor TR, the semiconductor layer 340 in the channel region is removed. Therefore, the dummy thin film transistor TR cannot perform a switching operation. The channel length of the thin film transistor may directly impact on a driving performance. The length $D_2$ of the channel of the unit thin film transistor TR_7' shown in FIG. 22B is larger than the length $D_1$ of the channel of the unit thin film transistor TR_5' shown in FIG. 22C. Therefore, the driving performance of the unit thin film transistor TR_5' shown in FIG. 22C is higher than that of the unit thin film transistor TR_7' shown in FIG. 22B.

The transmittances of the transflective regions of the mask (see, "M" in FIGS. 9A and 9B) for forming the unit thin film transistors TR_1' to TR_8' of the thin film transistor TR may be different from each other for the unit thin film transistors. In this way, it is possible to form a dummy thin film transistor and unit thin film transistors having different channel lengths by adjusting the transmittances of the transflective regions of the mask.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor substrate comprising:
a gate electrode formed on an insulating substrate;
a semiconductor layer formed on the gate electrode; and
a gate driver comprising a plurality of thin film transistors each having a source electrode and a drain electrode that are formed on the gate electrode and the semiconductor layer so as to be spaced apart from each other,
wherein at least one of the plurality of thin film transistors include the gate electrode and has a gap between the source electrode and the drain electrode, and the gap is directly on the gate electrode.

2. The thin film transistor substrate of claim 1, wherein about 20 to 60% of the plurality of thin film transistors are the at least one of the plurality of thin film transistors.

3. The thin film transistor substrate of claim 1, further comprising a shift register having a plurality of stages connected to each other in a cascade manner and being formed on the insulating substrate, each of the stages including:
a pull-up unit outputting a first clock signal as a gate signal in response to the signal of a first node to which a first input signal is input;
a pull-down unit discharging the gate signal with an off voltage when receiving a second input signal;
a discharge unit discharging the signal of the first node with the off voltage in response to the second input signal; and
a holding unit holding the signal of the first node as the gate signal discharged with the off voltage in response to the first clock signal,
wherein one or more of the thin film transistors among the plurality of thin film transistors are configured to control the operation of respective stages of the plurality of stages.

4. The thin film transistor substrate of claim 3, wherein each of the plurality of thin film transistors has the gate electrode to which the first clock signal is supplied, the drain electrode connected to the first node, and the source electrode connected to a gate line.

5. A thin film transistor substrate comprising:
a gate electrode formed on an insulating substrate;
a semiconductor layer formed on the gate electrode; and
a plurality of thin film transistors each having a source electrode and a drain electrode formed on the gate electrode and the semiconductor layer so as to be spaced apart from each other and having a respective channel,
a shift register having a plurality of stages connected to each other in a cascade manner and being formed on the insulating substrate,
wherein each of the stages include:
a pull-up unit outputting a first clock signal as a gate signal in response to the signal of a first node to which a first input signal is input;
a pull-down unit discharging the gate signal with an off voltage when receiving a second input signal;
a discharge unit discharging the signal of the first node with the off voltage in response to the second input signal; and
a holding unit holding the signal of the first node as the gate signal discharged with the off voltage in response to the first clock signal and including the plurality of thin film transistors;
wherein one or more of the thin film transistors among the plurality of thin film transistors are configured to control the operation of respective stages of the plurality of stages, and
wherein one or more of the thin film transistors among the plurality of thin film transistors have different channel lengths.

6. The thin film transistor substrate of claim 5, wherein each of the plurality of thin film transistors has the gate electrode to which the first clock signal is supplied, the drain electrode connected to the first node, and the source electrode connected to a gate line.

* * * * *